United States Patent [19]
Mackay

[11] Patent Number: 5,349,192
[45] Date of Patent: Sep. 20, 1994

[54] SOLID STATE DETECTOR FOR POLARIZED X-RAYS

[75] Inventor: James F. Mackay, Madison, Wis.

[73] Assignee: Wisconsin Alumni Research Foundation, Madison, Wis.

[21] Appl. No.: 65,127

[22] Filed: May 20, 1993

[51] Int. Cl.[5] .......................... G01T 1/32; G01T 1/24; H01L 31/0232
[52] U.S. Cl. ................................. 250/370.01; 378/84; 378/85
[58] Field of Search ................. 378/85, 84; 250/370.01

[56] References Cited

U.S. PATENT DOCUMENTS

| | | | |
|---|---|---|---|
| 5,163,078 | 11/1992 | Iketaki | 378/85 |
| 5,199,058 | 3/1993 | Tani et al. | 378/82 |
| 5,265,143 | 11/1993 | Early et al. | 378/84 |

*Primary Examiner*—Constantine Hannaher
*Attorney, Agent, or Firm*—Quarles & Brady

[57] ABSTRACT

A solid state x-ray detector has a set of bilayers formed on its front surface. Each bilayer includes a spacing layer and an absorbing layer which have different indexes of refraction, and the impinging x-rays strike the bilayers at an angle which satisfies the Bragg condition. As a result, x-rays polarized in one direction are substantially reflected while x-rays polarized in an orthogonal direction pass through the bilayers for detection by the solid state x-ray detector.

4 Claims, 1 Drawing Sheet

U.S. Patent  Sep. 20, 1994  5,349,192
FIG. 1
REFLECTED X-RAYS
INCIDENT X-RAYS
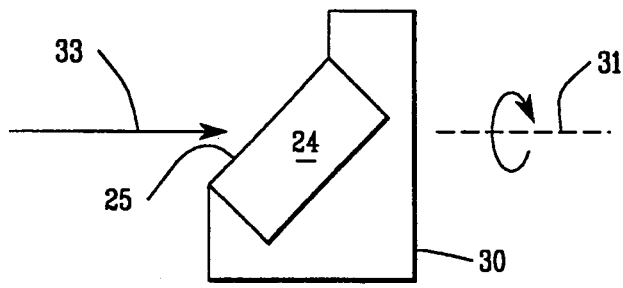
FIG. 2
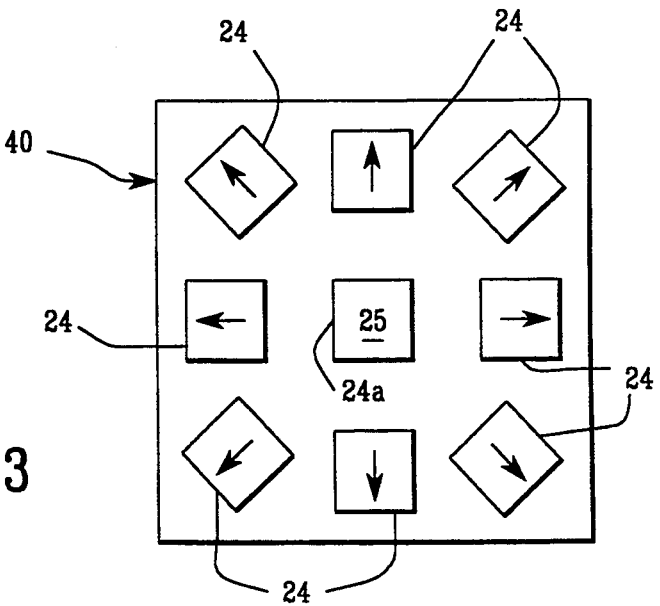
FIG. 3

SOLID STATE DETECTOR FOR POLARIZED X-RAYS

This invention was made with United States Government support awarded by the National Institute of Health (NIH), Grant No. CA 52475-02. The United States Government has certain rights in the invention.

BACKGROUND OF THE INVENTION

The field of the invention is radiation detectors and, more particularly, solid state x-ray detectors used singly or in arrays.

X-ray flux density is usually measured in one of two ways. First, a scintillation element may be used to convert the impinging x-rays into a luminescent intensity which is detected by a separate photomultiplier tube or a silicon photosensitive device. Such detectors are described, for example, in U.S. Pat. No. 5,103,092. Or second, photovoltaic or photoconductive solid state diodes that are directly sensitive to impinging x-rays may be used to produce electric currents. Such x-ray detectors are disclosed, for example, in U.S. Pat. Nos. 2,885,562; 3,598,997; 3,329,815; 4,926,052; and 5,103,100. Such x-ray detectors may be used singly, or they may be combined to form arrays of detectors.

In some applications, it is desirable to polarize the x-rays that impinge on the x-ray detector. One such application is described, for example, in U.S. Pat. No. 4,227,082, where a separate polarizer element is mounted in front of the x-ray detector. This approach can become awkward and expensive in some applications where polarized x-rays are required. For example, when an array of x-ray detectors are employed the use of separate polarizer elements is complex. Or, when the polarizer is to be rotated to observe the polarization characteristics of an x-ray source, the resulting structure is awkward and expensive.

SUMMARY OF THE INVENTION

The present invention relates to a solid state x-ray detector in which a polarizer is integrally formed as part of the x-ray detector. More particularly, the present invention includes a solid state x-ray detector which presents a substantially flat surface for receiving x-rays to be detected; a multilayer polarizing structure formed on the flat surface and including alternating layers of a material having a relatively high index of refraction and a material having a relatively low index of refraction; and means for mounting the solid state x-ray detector such that the x-rays strike the flat surface at an angle such that the multilayer polarizing structure reflects substantially more x-rays having a first polarization than x-rays having a second, orthogonal polarization.

A general object of the invention is to provide a solid state x-ray detector which is sensitive to x-ray polarization. The multilayer polarizing structure is comprised of alternating layers of materials which are deposited on the surface of the x-ray detector using well known methods such as sputter deposition. These layers are very thin and become an integral part of the x-ray detector. The direction of polarization is determined by the angle and orientation at which the resulting structure is positioned with respect to the impinging x-rays.

Another object of the invention is to provide a polarized x-ray detector which is inexpensive to make and convenient to use. The multilayer polarizing structure is formed as additional steps during the manufacture of the solid state x-ray detector. These additional steps of depositing the alternating layers may use the same technology employed to form the x-ray detector itself. No additional mechanical support is needed for the polarizing structure, thus reducing its cost and making it very easy to revolve the detector or to build arrays of polarized x-ray detectors.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1 is a view in cross section of an x-ray detector diode which employs the polarization structure of the present invention;

FIG. 2 is a pictoral view of the x-ray detector diode of FIG. 1 illustrating its orientation; and FIG. 3 is a pictoral view of an array of x-ray detector diodes of FIG. 1.

DESCRIPTION OF THE PREFERRED EMBODIMENT

Referring particularly to FIG. 1, the semiconductive x-ray detector device includes a semiconductor substrate 10 of the p-conductivity type having a front surface 11 and a back surface 12. An n-conductivity type semiconductor region 13 is formed in the front surface of the substrate 10 to form a pn junction 14 between the semiconductor regions 10 and 13. The edge 15 of this pn junction 14 forms a circle on the substantially flat front surface 11. When x-rays impinge on the surface 11, electrons and holes are produced in pairs at the junction 14 and a current flows in a circuit (not shown) which includes the diode. The amount of current flow is a direct measure of the incident x-ray flux density.

There are numerous semiconductor x-ray detector diodes known to the art and the present invention may be applied to any of them. As will now be described, the polarization structure is formed on the front surface 11 using the same methods and equipment employed to manufacture the diode itself. An x-ray diode such as that described in by L. R. Canfield, J. Kerner and R. Korde, in *Applied Optics*, 28, 3940 (1989) and R. Korde, L. R. Canfield and B. Wallis in *SPIE*, 932, 153–160 (1988) are typical of the devices to which the present invention may be applied.

Referring still to FIG. 1, the polarizing structure is comprised of alternating layers 20 and 21 of materials which have a substantially different index of refraction for the impinging x-rays. Each such bilayer 22 is approximately 90 Angstroms thick and is formed by deposition of a twenty Angstrom absorbing layer 21 of rhodium and a seventy Angstrow spacing layer 20 of silicon. In the preferred embodiment, twenty of these bilayers 22 are deposited on the front surface 11 of the x-ray detector diode using a sputter deposition process. The resulting x-ray detector 24 presents a substantially flat front surface 25 that is parallel to the front surface 11 of the x-ray detector diode. When the structure is oriented such that x-rays impinge at an angle $\theta$ with respect to the front surface 25, the bilayers 22 reflect or absorb 90% of the x-rays polarized in the plane of the front surface 25 ($\vec{s}$) while they absorb 60% of the x-rays polarized in the orthogonal direction ($\vec{p}$). For 100 keV x-rays, the polarization structure thus provides a factor of four difference in the sensitivity of the x-ray detector diode to the ($\vec{s}$) ($\vec{p}$) polarization. In other words, 40% of the ($\vec{p}$) polarized x-rays are detected while only 10% of the ($\vec{s}$) polarized x-rays are detected.

The materials selected for the bilayers 22 as well as the number of bilayers used will depend on a number of factors, including the energy of the x-rays and their strength. The degree of polarization depends on both the selection of materials and the number of bilayers used. The more bilayers used, the greater the polarization sensitivity. But, a larger number of bilayers also reduces the x-ray flux reaching the detector diode, and as a result, an increased number of bilayers 22 reduces the signal-to-noise ratio of the x-ray detector 24. Materials suitable for the absorbing layer 21 are listed in Table A and those suitable for the spacing layer 20 are listed in Table B. Polarized sensitivity is maximized when the angle $\theta$ is set to satisfy the Bragg condition $$\eta\lambda = 2d \sin\theta$$

where:
- $\lambda$ = x-rays wavelength;
- d = bilayer thickness;
- $\theta$ = angle of incidence; and
- $\eta$ = a whole number.

TABLE A

Rhodium
Tungsten
Molybdenum
Cobalt
Platinum

TABLE B

Silicon
Carbon
Boron
Beryllium

While the bilayers 22 are deposited by sputtering in the preferred embodiment, other methods may be used. For example, evaporation deposition, molecular beam epitaxy or chemical vapor deposition may be used, and will depend primarily on the manufacturing equipment and expertise available.

Referring particularly to FIG. 2, the polarized x-ray detector 24 is an integral unit which may be used in a number of applications. In one application, a single polarized x-ray detector 24 is mounted to a base 30 which rotates about an axis 31. The front surface 25 is disposed at an angle 0 with respect to the rotary axis 31 which satisfies the Bragg condition in accordance with the above formula. As a result, when the rotary axis 31 is aligned with the impinging x-rays 33, the signal produced by the polarized x-ray detector 24 will vary in magnitude as a function of x-ray polarization as it is rotated about the axis 31. In other words, during one revolution about the axis 31 the polarized x-ray detector 24 will produce a signal which indicates by its strength how the impinging x-rays 33 are polarized.

In another application shown in FIG. 3, an array 40 of nine polarized x-ray detectors 24 are employed to measure the polarization of x-rays impinging orthogonal to the front surface 25 of a central reference detector 24a. The front surfaces 25 of the remaining eight detectors 24 are tilted at the Bragg angle $\theta$ in the directions indicated by the arrows to measure the impinging x-rays at eight different polarizing angles. The signals produced by the nine x-ray detectors 24 provide an accurate indication of x-ray flux density and the degree to which the x-rays are polarized.

It should be apparent to those skilled in the art that other applications are easily implemented with the integral polarized x-ray detector 24. Additional detectors 24 optimized for other wavelengths and x-ray energy levels may be added to the array 40 or additional detectors 24 optimized for other wavelengths and x-ray energy levels may be mounted as in FIG. 2 for rotation about axis 31.

What is claimed is:

1. A solid state polarized x-ray detector which comprises:
   a solid state x-ray detector for producing an electric current which is indicative of the flux density of x-rays impinging on a substantially flat surface;
   a bilayer formed on the flat surface and including a spacing layer of a first material and an absorbing layer of a second material said first and second materials having substantially different indexes of refraction and a front surface on the bilayer being oriented at an angle $\theta$ with respect to the direction of the impinging x-rays such that a substantial portion of the impinging x-rays polarized in the direction in the plane of the front surface are reflected while a substantial portion of the impinging x-rays polarized in direction orthogonal thereto pass through the bilayer to impinge the flat surface of the solid state x-ray detector.

2. The polarized x-ray detector as recited in claim 1 in which a plurality of said bilayers are formed on the flat surface, one on top of the other.

3. The polarized x-ray detector as recited in claim 1 in which the first material is selected from a first group including silicon, carbon, boron and beryllium and the second material is selected from a second group including rhodium, tungsten, molybdenum, cobalt and platinum.

4. The polarized x-ray detector as recited in claim 1 in which the angle $\theta$ is set to satisfy the Bragg condition:

$$\eta\lambda = 2d \sin\theta$$

where $\lambda$ is the wavelength of the impinging x-rays, d is the thickness of said bilayer and $\eta$ is a whole number.

* * * * *